United States Patent
LaCroix

(10) Patent No.: US 9,316,508 B2
(45) Date of Patent: Apr. 19, 2016

(54) MAGNETIC ENCODER FOR PRODUCING AN INDEX SIGNAL

(71) Applicant: The Timken Company, North Canton, OH (US)

(72) Inventor: Mark LaCroix, Winchester, NH (US)

(73) Assignee: The Timken Company, North Canton, OH (US)

(*) Notice: Subject to any disclaimer, the term of this patent is extended or adjusted under 35 U.S.C. 154(b) by 0 days.

(21) Appl. No.: 14/389,855

(22) PCT Filed: Mar. 13, 2013

(86) PCT No.: PCT/US2013/030731
§ 371 (c)(1),
(2) Date: Oct. 1, 2014

(87) PCT Pub. No.: WO2013/158257
PCT Pub. Date: Oct. 24, 2013

(65) Prior Publication Data
US 2015/0091554 A1  Apr. 2, 2015

Related U.S. Application Data

(60) Provisional application No. 61/636,335, filed on Apr. 20, 2012.

(51) Int. Cl.
*G01B 7/14* (2006.01)
*G01D 5/244* (2006.01)
(Continued)

(52) U.S. Cl.
CPC .............. *G01D 5/244* (2013.01); *G01D 5/2457* (2013.01); *H03M 1/308* (2013.01)

(58) Field of Classification Search
CPC .................................................... F15B 15/2846
USPC ............... 324/207.24, 173, 174, 200, 207.11, 324/207.25
See application file for complete search history.

(56) References Cited

U.S. PATENT DOCUMENTS 4,713,613 A    12/1987  Takahashi
5,430,373 A *  7/1995  Ichikawa ............. G01D 5/2497
                                                 324/207.21

(Continued)

FOREIGN PATENT DOCUMENTS

EP          0443938      8/1991
JP          S57154014 A  9/1982

(Continued)

OTHER PUBLICATIONS

International Search Report and Written Opinion for PCT/US2013/030731, dated Dec. 10, 2013, 10 pages.

(Continued)

*Primary Examiner* — Benjamin M Baldridge
*Assistant Examiner* — Giovanni Astacio-Oquendo
(74) *Attorney, Agent, or Firm* — Michael Best & Friedrich LLP

(57) ABSTRACT

A magnetic encoder has a high resolution track including a plurality of North/South pole pairs defining a plurality of pole junctions, and a reference track including a North/South pole pair defining a North/South pole junction aligned with a first pole junction of the high resolution track, and a South/North pole junction aligned with a second pole junction of the high resolution track. Only a single pole junction of the high resolution track is positioned between the first and second pole junctions of the high resolution track.

19 Claims, 5 Drawing Sheets

(51) Int. Cl.
  *H03M 1/30* (2006.01)
  *G01D 5/245* (2006.01)

(56) References Cited

U.S. PATENT DOCUMENTS

| | | | | |
|---|---|---|---|---|
| 5,545,985 | A | * | 8/1996 | Campbell ................ 324/207.21 |
| 5,606,256 | A | * | 2/1997 | Takei ....................... 324/207.21 |
| 5,898,301 | A | | 4/1999 | La Croix et al. |
| 5,965,825 | A | | 10/1999 | Nitecki |
| 6,400,143 | B1 | * | 6/2002 | Travostino ........... G01D 5/2457 324/174 |
| 7,112,956 | B2 | * | 9/2006 | Shibata ................. G11B 19/28 310/68 B |
| 7,969,148 | B2 | * | 6/2011 | Noguchi ............... G01D 5/145 324/207.21 |
| 2004/0016305 | A1 | * | 1/2004 | Matsumoto et al. ..... 73/862.331 |
| 2005/0218888 | A1 | * | 10/2005 | Sethu .................. G01D 5/2497 324/207.21 |
| 2007/0143658 | A1 | * | 6/2007 | Low ........................ H04L 1/206 714/755 |
| 2009/0009160 | A1 | * | 1/2009 | LaCroix ................... 324/207.25 |
| 2009/0018791 | A1 | * | 1/2009 | Dejong .................. B65H 5/062 702/96 |
| 2009/0091316 | A1 | * | 4/2009 | Santos et al. ............. 324/207.25 |
| 2011/0291646 | A1 | * | 12/2011 | Musha ................ G01D 5/2457 324/207.11 |
| 2012/0206081 | A1 | * | 8/2012 | Sun ...................... H02K 41/031 318/686 |

FOREIGN PATENT DOCUMENTS

| | | |
|---|---|---|
| JP | H0820271 B2 | 3/1996 |
| JP | H10170211 A | 6/1998 |

OTHER PUBLICATIONS

Office Action from the Japanese Patent Office for Application No. 2015-506994 dated Aug. 11, 2015 (6 pages).

* cited by examiner

MAGNETIC ENCODER FOR PRODUCING AN INDEX SIGNAL

BACKGROUND

The present invention relates to magnetic encoders, and more particularly to magnetic encoders for producing an index signal.

SUMMARY

In one embodiment, the invention provides a magnetic encoder with a high resolution track including a plurality of North/South pole pairs defining a plurality of pole junctions, and a reference track including a North/South pole pair defining a North/South pole junction aligned with a first pole junction of the high resolution track, and a South/North pole junction aligned with a second pole junction of the high resolution track. Only a single pole junction of the high resolution track is positioned between the first and second pole junctions of the high resolution track.

The invention also provides a magnetic encoder having a high resolution track including a plurality of North/South pole pairs defining a plurality of pole junctions, and a reference track including a North/South pole pair defining a North/South pole junction and a South/North pole junction. The plurality of pole junctions of the high resolution track includes consecutive first, second, and third pole junctions. The first pole junction is aligned with the North/South pole junction of the reference track, the third pole junction is aligned with the South/North pole junction of the reference track, and the second pole junction is between the first and third pole junctions.

The invention also provides a magnetic encoder having a high resolution track including a plurality of North/South pole pairs defining a plurality of pole junctions, and a reference track including at least one North/South pole pair. One of the poles of the at least one North/South pole pair of the reference track has a shorter length than the other. The encoder detects signals at a select number of position indicator locations corresponding to select pole junctions of the high resolution track, and the length of the shorter pole of the at least one North/South pole pair of the reference track is sized to encompass only a single one of the position indicator locations to thereby define an index pulse.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
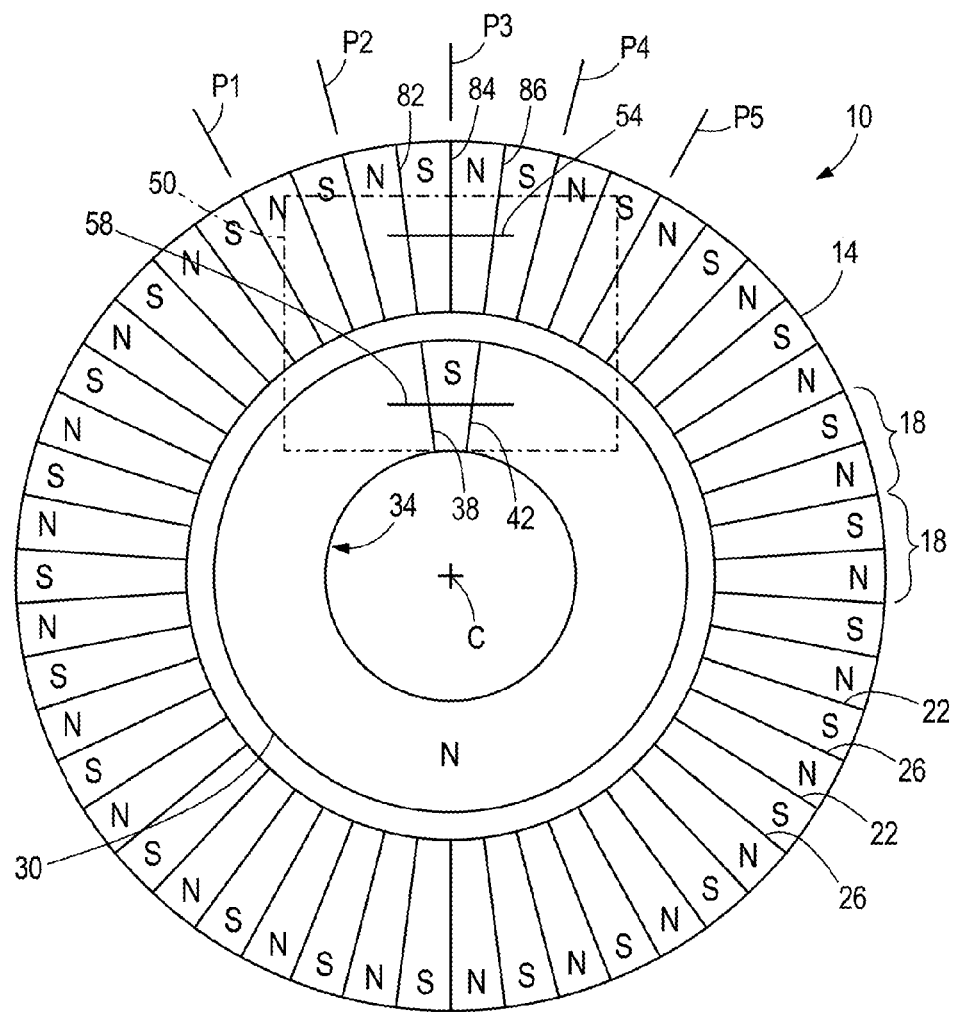
FIG. 1 is a schematic representation of a circular-track magnetic encoder embodying the invention.

FIG. 1 illustrates a magnetic encoder 10 of the present invention. The encoder 10 includes a high resolution track 14 including a plurality of North/South pole pairs 18. The pole pairs 18 define a plurality of pole junctions, including North/South pole junctions 22 and South/North pole junctions 26. In the illustrated embodiment, the pole pairs 18 are all the same size, but this need not be the case. The number of pole pairs 18 and resulting pole junctions 22, 26 can vary from that shown in FIG. 1.

Figure 3:
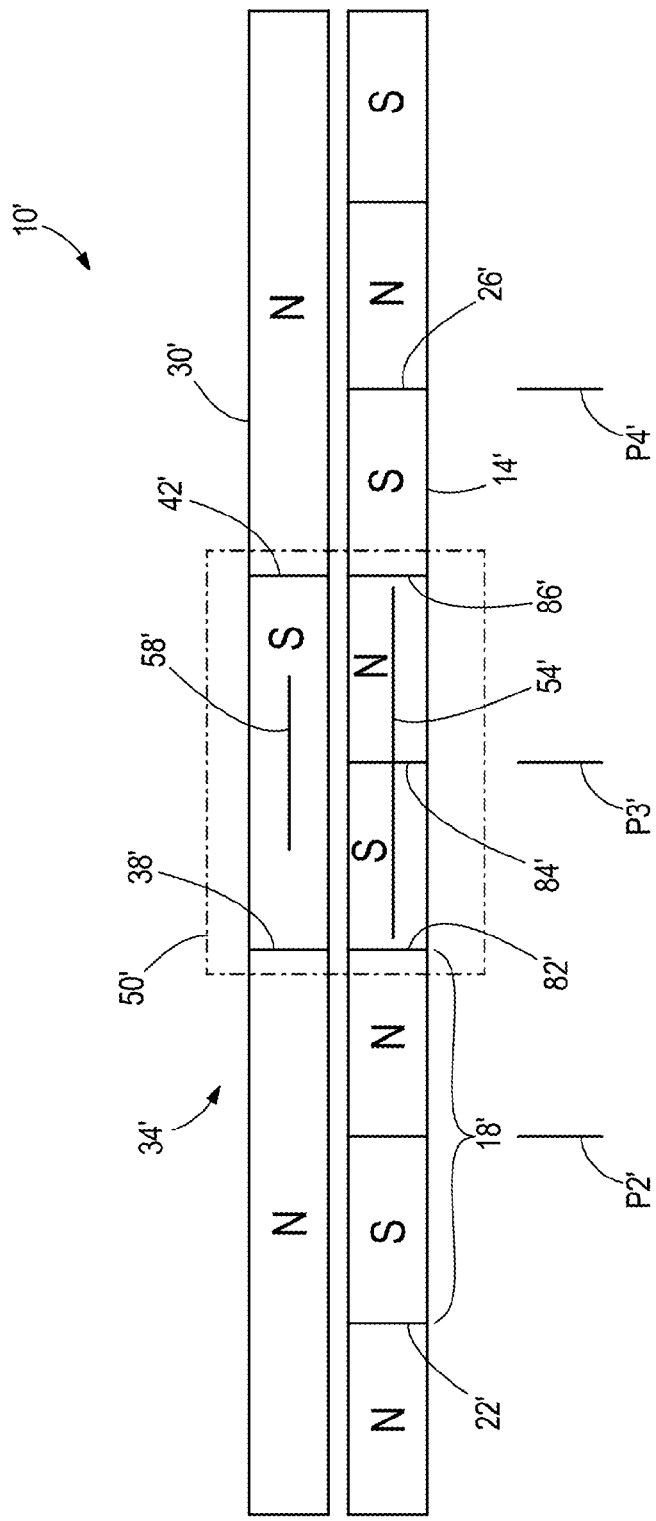
FIG. 3 is a graphical representation of a linear-track magnetic encoder embodying the invention.

The illustrated encoder 10 further includes a reference track 30 fixed relative to the high resolution track 14 and including only a single North/South pole pair 34 defining a single North/South pole junction 38 and a single South/North pole junction 42. The pole pair 34 includes a shorter pole and a longer pole. The shorter pole of the single North/South pole pair 34 (the South pole in the illustrated embodiment) has an angular span that is equal to the angular span of one of the North/South pole pairs 18 of the high resolution track 14 (e.g., 14.4 degrees in the illustrated embodiment). The phrase "angular span," as used herein and in the appended claims refers to the angular length or length dimension of the referenced pole or pole pair as measured relative to the center point C. While the illustrated embodiment shows the South pole of the pole pair 34 being shorter (i.e., having a shorter angular span) than the North pole, in other embodiments, the North pole could be the shorter pole of the pole pair 34 and the South pole could have the longer length. Additionally, while the reference track 30 is illustrated as being radially inside the high resolution track 14, it is to be understood that the reference track 30 could alternatively be positioned radially outside of the high resolution track 14. Additionally, while the high resolution track 14 and the reference track 30 are illustrated as being formed as concentric circles, in other embodiments, the tracks 14, 30 could be formed as linear tracks arranged parallel to one another (see FIG. 3—like parts have been given like reference numbers plus the prime (') symbol). The same relationships already mentioned above and further described below for the circular-track encoder 10 would be maintained for a linear-track encoder 10' except that "angular spans" or "angular lengths" would simply be converted to "linear lengths." Both "angular lengths" and "linear lengths" ultimately define length dimensions of the poles. Additionally, when converted to a linear track 30', the pole pair 34' is embodied as a South pole embedded in a larger North pole such that there will be one pole (the South pole in FIG. 3) surrounded by the other pole (the North pole on both sides of the South pole in FIG. 3).

The tracks 14, 30 of the encoder 10, while illustrated as being completely separate from one another, are typically formed on a single piece of magnetizable material. The separate tracks 14, 30 are created using tooling and known techniques to magnetize the material to form the tracks 14, 30.

The encoder 10 further includes a sensor chip 50 positioned over and spaced from the tracks 14, 30. A high resolution sensor 54, which can take the form of a string or array of sensors (e.g., Hall sensors), is positioned over the high resolution track 14. A reference sensor 58, which can take the form of a string or array of sensors (e.g., Hall sensors), is positioned over the reference track 30.

The encoder 10 outputs signals (see FIG. 2) based on relative movement between the sensor chip 50 and the tracks 14, 30 (e.g., rotation for the concentric-track encoder 10, or translation for a linear-track encoder 10'). The track configurations of the invention provide for the generation of an index signal or pulse that indicates a reference or index position of the tracks 14, 30. For example, when the tracks 14, 30 are positioned on a rotating target wheel to rotate with the target wheel, the single index position could be indicative of a desired angular position, such as top-dead-center, bottom-dead-center, or another significant position.

Figure 2:
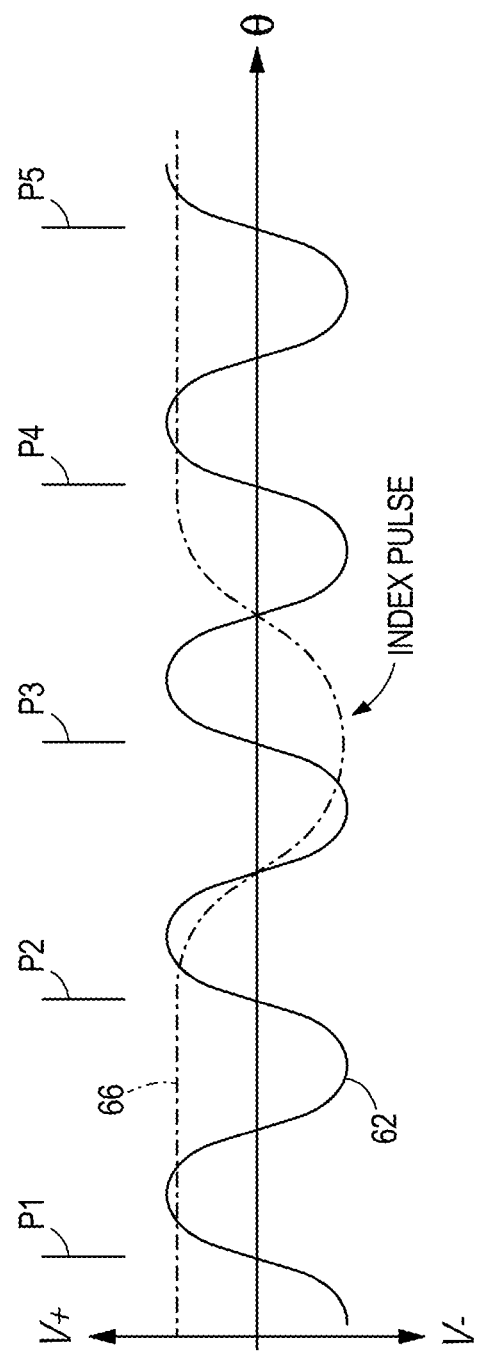
FIG. 2 is a graphical representation of the signals generated by the encoder of FIG. 1.

FIG. 2 is a graphical representation of the signals generated by the encoder 10. The horizontal axis represents angular position θ of the tracks 14, 30, while the vertical axis represents a voltage V associated with each of the sensors 54, 58 on the chip 50. The line 62 represents the signal from the high resolution track 14 (as detected by the high resolution sensor 54), while the line 66 represents the signal from the reference track 30 (as detected by the reference sensor 58). FIGS. 1 and 2 have been labeled with corresponding position indicators P1, P2, P3, P4, and P5 to facilitate correlation of the track positions to the generated signals.

Referring to the signal 62 generated by the high resolution track 14, it can be seen that the voltage changes from positive to negative at each North/South pole junction 22, and changes from negative to positive at each South/North pole junction 26. In the illustrated arrangement, a South pole generates a negative voltage reading, while a North pole generates a positive voltage reading. In other embodiments, the positive and negative voltages associated with the polarities can be reversed. Referring to the signal 66 generated by the reference track 30, it can be seen that the voltage changes from positive to negative at the North/South pole junction 38, and changes from negative to positive at the South/North pole junction 42.

The sensors 54, 58 detect voltages or voltage crossovers at each South/North pole junction 26 (at each position indicator P1, P2, P3, P4, P5, etc.) along the high resolution track 14, and detect an index signal or pulse at position indicator P3, because this location is the only position indicator location over the entire 360 degrees of rotation in which the voltage of the reference signal 66 is less than the voltage of the high resolution signal 62. In other embodiments, the position indicators could be located at each pole junction (22 and 26) instead of only at every other pole junction (22 or 26). The sensor chip 50 compares the voltage values of the high resolution signal 62 and the reference signal 66 at each position indicator or South/North pole junction 26 of the high resolution signal 62 to discern when the index pulse is generated. In embodiments in which the voltage values associated with the polarities are reversed, the index signal could be the only position over the entire 360 degrees of rotation in which the voltage of the reference signal 66 is more than the voltage of the high resolution signal 62. In other words, the signal 66 from the reference track creates a single outlier or anomaly in relation to the signal 62 from the high resolution track 14 that can be detected by the circuitry as the index signal or pulse.

More specifically, the high resolution track 14, at each position indicator P1, P2, P3, P4, and P5, defines a South/North pole junction 26 that correlates to a voltage crossover point (i.e., where V=0) from negative to positive. Likewise, the high resolution track 14, at each North/South pole junction 22 between the position indicators P1, P2, P3, P4, and P5, correlates to a voltage crossover point from positive to negative. The position indicators P1, P2, P4, and P5 are all within the angular span of the North pole of the reference track 30, correlating to a positive voltage value for the reference signal 66. Only the position indicator P3 is within the single South pole of the reference track 30, correlating to a negative voltage value for the reference signal 66. Only at position P3 is the value of the reference signal 66 less than the zero value at the voltage crossover of the high resolution signal 62. Therefore, the chip 50 generates an index signal or pulse at a location relative to the tracks 14, 30 coinciding with the position indicator P3.

The specific pole pair arrangements of the high resolution track 14 and the reference track 30 make possible this capability of creating the single index signal at position indicator P3. Specifically, high resolution track 14 includes first, second, and third consecutive pole junctions designated as 82, 84, and 86, respectively (the pole junctions 82, 84, and 86 are three of the plurality of pole junctions 22, 26 of the high resolution track 14). The first pole junction 82 is aligned with the North/South pole junction 38 of the reference track 30, the third pole junction 86 is aligned with the South/North pole junction 42 of the reference track 30, and the second pole junction 84 is between the first and third pole junctions 82, 86. As used herein and in the appended claims, the term "aligned" means that the reference pole junctions are at the same angular position relative to the center point C for the illustrated concentric track arrangement. In an alternative embodiment in which the tracks are formed as linear tracks arranged parallel to one another (see FIG. 3), the term "aligned" means that the referenced pole junctions are co-linear with one another. This relationship would also hold true if the North pole of the reference track 30 were the shorter pole.

To describe the relationship in another way, the single North/South pole junction 38 of the reference track 30 is aligned with a first pole junction 82 of the plurality of pole junctions 22, 26 of the high resolution track 14, and the single South/North pole junction 42 of the reference track 30 is aligned with a second pole junction 86 of the plurality of pole junctions 22, 26 of the high resolution track 14. Only a single pole junction 84 of the high resolution track 14 is positioned between the pole junctions 82 and 86 of the plurality of pole junctions 22, 26 of the high resolution track 14. All three pole junctions 82, 84, and 86 are therefore aligned with the shorter pole of the reference track 14 (i.e., the South pole in the illustrated embodiment). To state it yet another way, only a single pole junction 84 of the high resolution track 14 is positioned completely within the angular span between the North/South pole junction 38 and the South/North pole junction 42 of the reference track 30. There are no other pole junctions of the high resolution track 14 positioned within the angular span defined by the South pole (i.e., the shorter pole) of the single pole pair 34 of the reference track 30. The single pole junction 84 coincides with position indicator P3 and defines the index pulse.

The illustrated encoder 10 of the present invention provides an index pulse that is twice as wide (i.e., has twice the wavelength) as index pulses created in prior art encoders. The wider index pulse created by the encoder 10 means that a larger air gap can be used between the sensors 54, 58 and the tracks 14, 30. This is because the larger index pulse produces a magnetic field that extends farther from the tracks 14, 30 toward the sensor chip 50 than magnetic fields produced by narrower index pulses.

The track arrangement of the encoder 10 works well when the tracks 14, 30 can be spaced from one another and the sensors 54, 58 can also be spaced from one another on the sensor chip 50 such that the large, single North/South pole pair 34 of the reference track 30 does not cause interference between the generated signals. The track arrangement is also simplified relative to other encoders that have smaller and more complex configurations of pole junctions used to generate an index signal. This facilitates manufacture of the encoder 10, allowing the use of larger tooling.

The above discussion generally describes the encoder 10 illustrated in FIG. 1, however, those skilled in the art will contemplate and understand other embodiments and configurations falling within the scope and breadth of the present invention. For example, while the index pulse illustrated in FIG. 2 is twice the wavelength of the high resolution signal 62, it should be understood that the index pulse could be narrowed or widened somewhat and still provide the desired index pulse. Specifically, to narrow the index pulse, the angular span of the South pole of the illustrated single pole pair 34 of the reference track 30 could be shortened (or alternatively the angular span of the pole pairs 18 of the high resolution track 14 could be lengthened) such that one or both of the pole junctions 82 and 86 were no longer aligned with the respective pole junctions 38, 42 of the reference track 30. As long as the pole junction 84 corresponding to position indicator P3 remains within the angular span of the South pole (i.e., the shorter pole) of the single pole pair 34 and angularly between the pole junctions 38 and 42, the index signal will still be generated at position indicator P3 because the voltage of the reference signal would still be less than the zero voltage of the high resolution signal at pole junction 84.

Likewise, to widen the index pulse, the angular span of the South pole of the illustrated single pole pair 34 of the reference track 30 could be lengthened (or alternatively the angular span of the pole pairs 18 of the high resolution track 14 could be shortened) as long as the reference signal voltage was only less than the high resolution signal at position indicator P3. In other words, the index pulse could be widened to a point just before the reference signal voltage dropped below the high resolution voltage at one or both of the position indicators P2 and P4. In yet other embodiments, it is contemplated that the circuitry could be modified to discern an index pulse upon detection of two or three consecutive position indicators (e.g., P2, P3, and P4) at which the reference signal is less than the high resolution signal.

Figure 4:
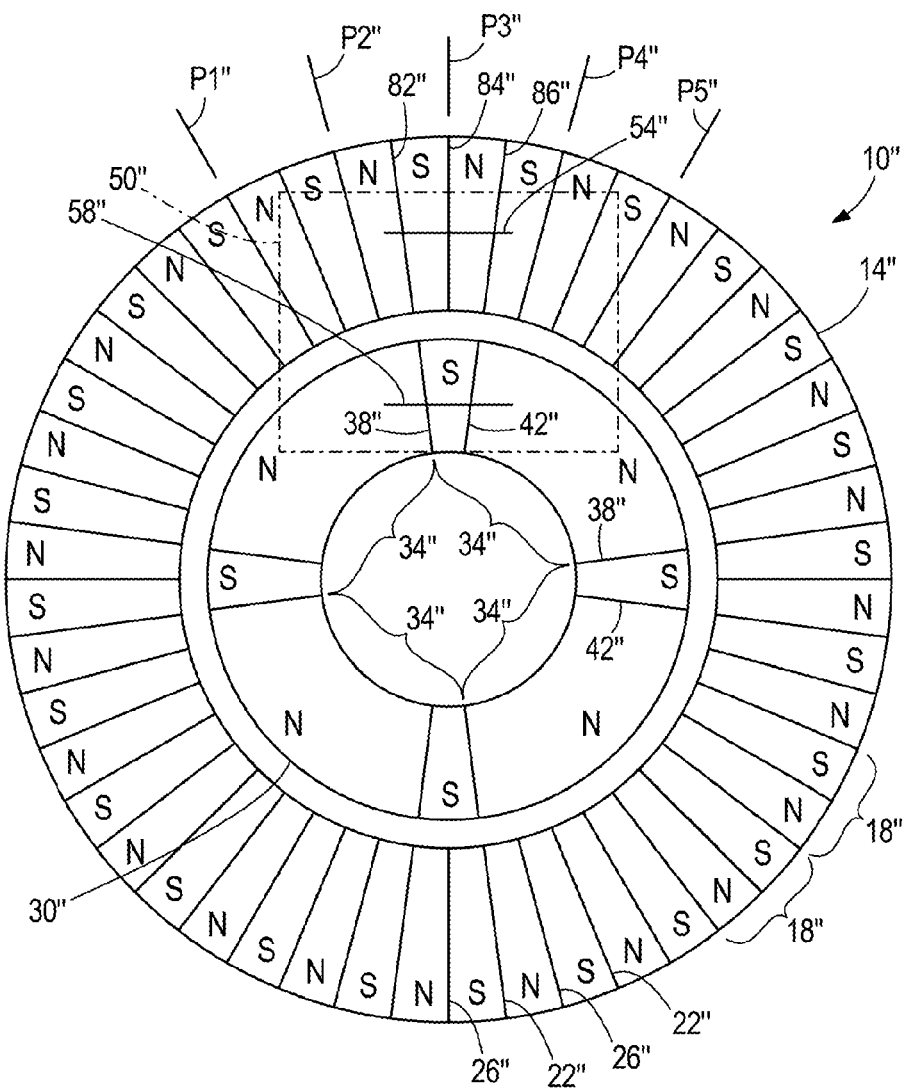
FIG. 4 is a graphical representation of another circular-track magnetic encoder embodying the invention.

In a further modification falling within the scope of the invention, the encoder could include 2 or more index pulses, typically being equally spaced about 1 revolution of the encoder. The same principles shown and described above using only the single North/South pole pair 34 of the reference track 30 could be implemented with two, three, four, or any desired number of North/South pole pairs on a reference track. In one application for a brushless DC motor, the encoder could have four index pulses by incorporating four North/South pole pairs on the reference track 30. FIG. 4 illustrates such an embodiment, with like parts given like reference numbers plus the double-prime (") symbol. The same correlations between the pole pairs 18" and pole junctions 22", 26" of the high resolution track 14" and the pole junctions 38" and 42" of each pole pair on the reference track are repeated in four angular locations of the modified encoder 10" to provide four index pulses. In that regard, each North/South pole pair 34" on the reference track 30" has one pole (e.g., the South pole) with a shorter angular span (i.e., shorter length) than the other pole (e.g., the North pole) of the pole pair 34", and the angular span of that shorter pole encompasses only a single one of the position indicator or detection locations of the high resolution track 14".

Figure 5:
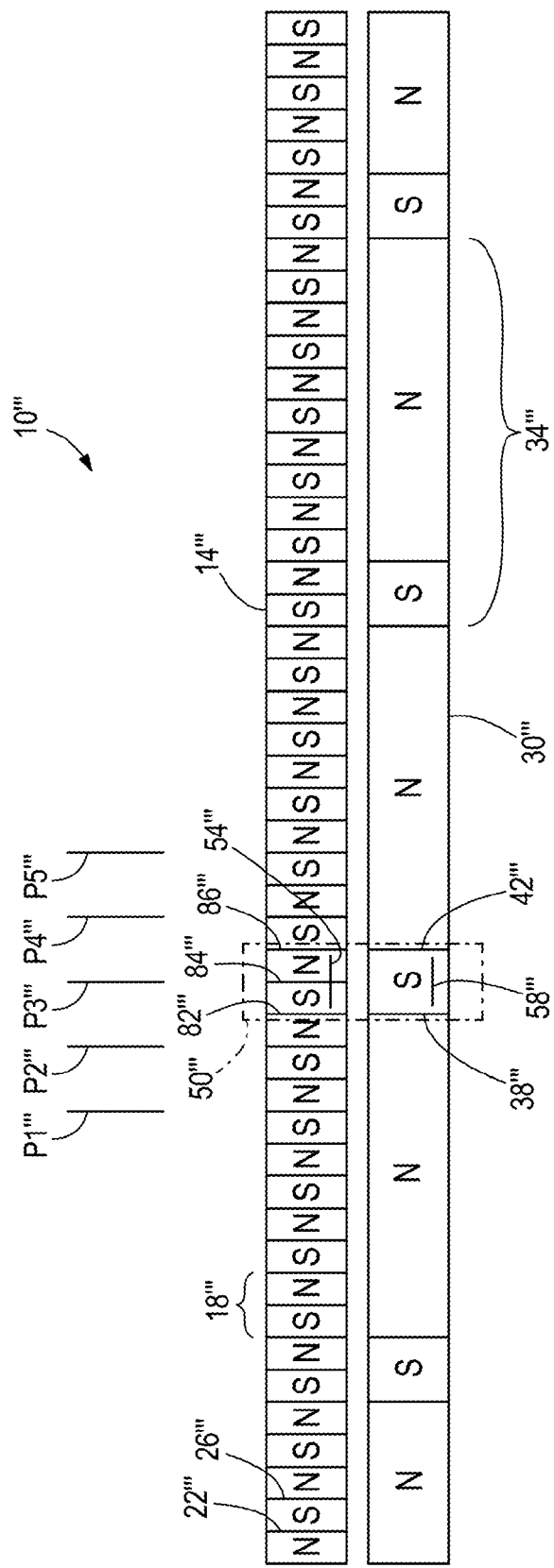
FIG. 5 is a graphical representation of another linear-track magnetic encoder embodying the invention.

FIG. 5 illustrates a linear-track encoder embodiment 10''' corresponding to the encoder 10" of FIG. 4. Like parts are given like reference numbers plus the triple-prime ("') symbol.

It should also be recognized that while the illustrated embodiments illustrate one possible configuration of North and South poles, all of the North poles could be changed to South Poles and all of the South poles could be changed to North poles without deviating from the scope of the invention. As used herein and in the appended claims, any reference to a North/South pole pair does not require any specific orientation (i.e., which pole is first/second or left/right in the pair). Furthermore, as used herein and in the appended claims, any reference to both a North/South pole junction and a South/North pole junction of a given North/South pole pair simply refers to two adjacent pole junctions defined by the pole pair, without requiring any specific orientation of the pole pair (i.e., which pole is first/second or left/right in the pair).

Various features and advantages of the invention are set forth in the following claims.

What is claimed is:

1. A magnetic encoder comprising:
    a high resolution track including a plurality of North/South pole pairs defining a plurality of pole junctions; and
    a reference track including only a single North/South pole pair defining a single North/South pole junction aligned with a first pole junction of the high resolution track, and a single South/North pole junction aligned with a second pole junction of the high resolution track;
    wherein only a single pole junction of the high resolution track is positioned between the first and second pole junctions of the high resolution track; and
    wherein a signal generated by the encoder at a location of the single pole junction of the high resolution track positioned between the first and second pole junctions defines an index pulse that is the only index pulse generated over an entire length of the encoder.

2. The magnetic encoder of claim 1, wherein one of the poles of the North/South pole pair of the reference track has a shorter length than the other pole, and wherein the single pole junction positioned between the first and second pole junctions is aligned with the shorter-length pole of the North/South pole pair of the reference track.

3. The magnetic encoder of claim 2, wherein the reference track is circular, and wherein the length of each pole on the reference track defines an angular span.

4. The magnetic encoder of claim 2, wherein the reference track is linear, and wherein the length of each pole on the reference track defines a linear length.

5. The magnetic encoder of claim 2, wherein the encoder detects signals at a number of position indicator locations corresponding to pole junctions of the high resolution track, and wherein the length of the shorter pole of the North/South pole pair of the reference track is sized to encompass only a single one of the position indicator locations to thereby define the index pulse.

6. The magnetic encoder of claim 2, wherein a length of the longer pole of the North/South pole pair of the reference track is sized to encompass more than one of the plurality of pole junctions of the high resolution track.

7. A magnetic encoder comprising:
    a high resolution track including a plurality of North/South pole pairs defining a plurality of pole junctions; and
    a reference track including a North/South pole pair defining a North/South pole junction and a South/North pole junction, one of the poles of the North/South pole pair having a shorter length than the other pole;
    wherein the plurality of pole junctions of the high resolution track includes consecutive first, second, and third pole junctions;
    wherein the first pole junction is aligned with the North/South pole junction of the reference track, the third pole junction is aligned with the South/North pole junction of the reference track, and the second pole junction is between the first and third pole junctions and aligned with the shorter pole of the reference track; and wherein a signal generated by the encoder at the second pole junction defines an index pulse that is the only index pulse generated over an entire length of the North/South pole pair of the reference track.

8. The magnetic encoder of claim 7, wherein the reference track is circular, and wherein the length of each pole on the reference track defines an angular span.

9. The magnetic encoder of claim 7, wherein the reference track is linear, and wherein the length of each pole on the reference track defines a linear length.

10. The magnetic encoder of claim 7, wherein the North/South pole pair on the reference track is the only North/South pole pair on the reference track.

11. The magnetic encoder of claim 7, wherein the North/South pole pair on the reference track is one of two or more North/South pole pairs on the reference track.

12. The magnetic encoder of claim 7, wherein the reference track contains more than one of the plurality of pole junctions aligned with the longer pole of the reference track.

13. A magnetic encoder comprising:
 a high resolution track including a plurality of North/South pole pairs defining a plurality of pole junctions; and
 a reference track including a North/South pole pair, one of the poles of the North/South pole pair of the reference track having a shorter length than the other;
 wherein the encoder detects signals at a number of position indicator locations corresponding to pole junctions of the high resolution track; and
 wherein the length of the shorter pole of the North/South pole pair of the reference track is sized to encompass only a single one of the position indicator locations to thereby define an index pulse that is the only index pulse generated over an entire length of the North/South pole pair of the reference track.

14. The magnetic encoder of claim 13, wherein the plurality of pole junctions of the high resolution track includes consecutive first, second, and third pole junctions;
 wherein the North/South pole pair of the reference track defines a North/South pole junction and a South/North pole junction; and
 wherein the first pole junction is aligned with the North/South pole junction of the reference track, the third pole junction is aligned with the South/North pole junction of the reference track, and the second pole junction is between the first and third pole junctions and coincides with the position indicator location defining the index pulse.

15. The magnetic encoder of claim 13, wherein the reference track is circular, and wherein the length of each pole on the reference track defines an angular span.

16. The magnetic encoder of claim 13, wherein the reference track is linear, and wherein the length of each pole on the reference track defines a linear length.

17. The magnetic encoder of claim 13, wherein the reference track includes two or more North/South pole pairs, each pair having a shorter pole sized to encompass only a single one of the position indicator locations to thereby define an index pulse.

18. The magnetic encoder of claim 13, wherein the reference track includes four North/South pole pairs, each pair having a shorter pole sized to encompass only a single one of the position indicator locations to thereby define an index pulse.

19. The magnetic encoder of claim 13, wherein a length of the longer pole of the North/South pole pair of the reference track is sized to encompass more than one of the position indicator locations.

* * * * *